(12) United States Patent
Park

(10) Patent No.: US 12,432,908 B2
(45) Date of Patent: Sep. 30, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Inho Park, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 480 days.

(21) Appl. No.: 17/952,257

(22) Filed: Sep. 25, 2022

(65) Prior Publication Data

US 2023/0016474 A1 Jan. 19, 2023

(30) Foreign Application Priority Data

Jun. 6, 2022 (CN) .......................... 202210630836.4

(51) Int. Cl.
*H10B 12/00* (2023.01)
*H01L 21/306* (2006.01)
*H01L 21/762* (2006.01)
*H10D 30/63* (2025.01)

(52) U.S. Cl.
CPC ..... *H10B 12/482* (2023.02); *H01L 21/30608* (2013.01); *H01L 21/76232* (2013.01); *H10B 12/0387* (2023.02); *H10B 12/053* (2023.02); *H10B 12/488* (2023.02); *H10D 30/63* (2025.01)

(58) Field of Classification Search
CPC .............. H10B 12/482; H10B 12/0387; H10B 12/053; H10B 12/488; H10D 30/63; H01L 21/30608; H01L 21/76232
See application file for complete search history.

(56) References Cited

U.S. PATENT DOCUMENTS

| 12,342,524 B2 * | 6/2025 | Jang ..................... H10B 12/315 |
| 2007/0075359 A1 | 4/2007 | Yoon et al. |
| 2015/0214231 A1 * | 7/2015 | Lee ..................... H10B 12/0335 257/296 |
| 2019/0198505 A1 * | 6/2019 | Liao ..................... H10B 12/488 |
| 2025/0192044 A1 * | 6/2025 | Chuang ............. H01L 21/76831 |

FOREIGN PATENT DOCUMENTS

CN 103515307 B 1/2018

* cited by examiner

*Primary Examiner* — Richard A Booth

(74) *Attorney, Agent, or Firm* — Kilpatrick Townsend & Stockton LLP

(57) ABSTRACT

Embodiments relate to a semiconductor structure and a method for fabricating the same. The method includes: providing a substrate, a first trench being formed in the substrate; forming a protective layer in the first trench, the protective layer covering a side wall and a bottom of the first trench; etching the protective layer and the substrate at the bottom of the first trench to form second trenches; forming a passivation layer at a bottom of each of the second trenches; and etching a side wall of each of the second trenches to form a groove, and forming a dielectric layer in the groove. The method can eliminate a process of forming a bit line contact structure, thereby reducing resistance of a bit line and simplifying fabrication processes of the bit line.

10 Claims, 10 Drawing Sheets

B-B'

A-A'

B-B'

A-A'

B-B'

A-A'

B-B'

A-A'

B-B'

A-A'

SEMICONDUCTOR STRUCTURE AND METHOD FOR FABRICATING SAME

CROSS-REFERENCE TO RELATED APPLICATION

This application claims priority to Chinese Patent Application No. 202210630836.4, titled "SEMICONDUCTOR STRUCTURE AND METHOD FOR FABRICATING SAME" and filed to the State Patent Intellectual Property Office on Jun. 6, 2022, the entire contents of which are incorporated herein by reference.

TECHNICAL FIELD

The present disclosure relates to the field of integrated circuit technology, and more particularly, to a semiconductor structure and a method for fabricating the same.

BACKGROUND

As a semiconductor memory commonly used in electronic devices such as computers, a dynamic random access memory (DRAM) includes a plurality of memory cells. Each memory cell includes a memory capacitor and a transistor electrically connected to the memory capacitor. Each transistor includes a gate, a source, and a drain. The gate of each transistor is configured to electrically connect a word line. The source of each transistor is configured to constitute a bit line contact region, to electrically connect a bit line by means of a bit line contact structure. The drain of each transistor is configured to constitute a memory node contact region, to electrically connect the memory capacitor by means of a memory node contact structure.

In a memory device whose transistor uses a vertical gate all around transistor (VGAA), the use of buried word lines and buried bit lines may simplify a structure (such as the bit line contact structure) between an array device and a capacitor. However, the existing buried bit lines still have problems of high resistance and complicated fabrication process of the bit line contact structure.

SUMMARY

On this basis, it is necessary to provide a semiconductor structure and a method for fabricating the same.

A method for fabricating the semiconductor structure includes following steps of: providing a substrate, a first trench being formed in the substrate; forming a protective layer in the first trench, the protective layer covering a side wall and a bottom of the first trench; etching the protective layer and the substrate at the bottom of the first trench to form second trenches; forming a passivation layer at a bottom of each of the second trenches; and etching a side wall of each of the second trenches to form a groove, and forming a dielectric layer in the groove.

Based on the same inventive concept, the embodiments of the present disclosure also provide a semiconductor structure, which may be fabricated and formed by the method in some of the foregoing embodiments.

The semiconductor structure includes: a substrate, a protective layer, and a dielectric layer. The substrate is internally provided with a first trench and a groove positioned below the first trench. The protective layer covers a side wall of the first trench. The dielectric layer fills the groove.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 19 and FIG. 20 are schematic structural diagrams of the semiconductor structure according to an embodiment.

REFERENCE NUMERALS IN THE ACCOMPANYING DRAWINGS

Figure 1:
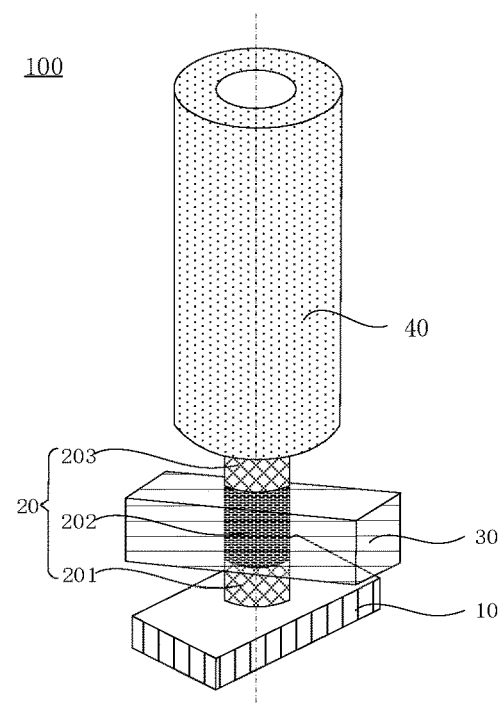
FIG. 1 is a schematic structural diagram of a memory cell according to an embodiment.

100—memory cell; 11—substrate; 111—shallow trench isolation structure; 12—first trench; 13—protective layer; 14—second trench; 15—passivation layer; 16—groove; 17—dielectric layer; 10—bit line; 20—columnar structure; 201—source; 202—conductive channel; 203—drain; 30—word line; 31—insulating layer; 310—insulating material; G—word line trench; and 40—memory capacitor.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Thus, without departing from the teachings of the present disclosure, a first element, component, region, layer, doping type or portion discussed below may be represented as a second element, component, region, layer or portion. For example, a first doping type may be a second doping type, and similarly, the second doping type may be the first doping type. Furthermore, the first doping type and the second doping type may be different doping types. For example, the first doping type may be a P type and the second doping type may be an N type, or the first doping type may be the N type and the second doping type may be the P type.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. For example, an injection region shown as a rectangle typically has circular or curved features and/or injection concentration gradients at its edges rather than a binary change from the injection region to a non-injection region. Likewise, a buried region formed by means of injection may result in some injections in a region between the buried region and a surface through which the injection proceeds. Thus, regions illustrated in the figures are schematic in nature and their shapes neither illustrate an actual shape of a region of the device nor limit the scope of the present disclosure.

A gate-all-around (GAA) transistor has more advantages in aspects such as miniature, high performance and low power consumption, and thus is considered to be a key core technology of next-generation integrated circuits. Taking a vertical gate-all-around (VGAA) transistor as an example, the transistor has more degrees of integration freedom in a vertical direction, which may effectively reduce a plane area occupied by the transistor, implement vertical stack between multi-layer devices more easily, and further increase integration density by means of a new wiring mode.

Referring to FIG. 1, some embodiments of the present disclosure provide a semiconductor structure, which includes, for example, memory cells 100 in a dynamic random access memory (DRAM). Each of the memory cells 100 includes the VGAA transistor, and a memory capacitor 40 positioned above the VGAA transistor and connected thereto. The VGAA transistor may be a columnar structure 20, where the columnar structure 20 includes a source 201, a conductive channel 202 and a drain 203 arranged from bottom to top. The source 201 is connected to a plurality of bit lines 10. The drain 203 is connected to the memory capacitor 40. A plurality of word lines 30 are provided on a periphery of the conductive channel 202, and a gate dielectric layer (not shown in FIG. 1) is provided between the conductive channel 202 and the word line 30. A portion of the word line 30 on an outer peripheral side of the conductive channel 202 may be used as a gate of the VGAA transistor.

Figure 2:
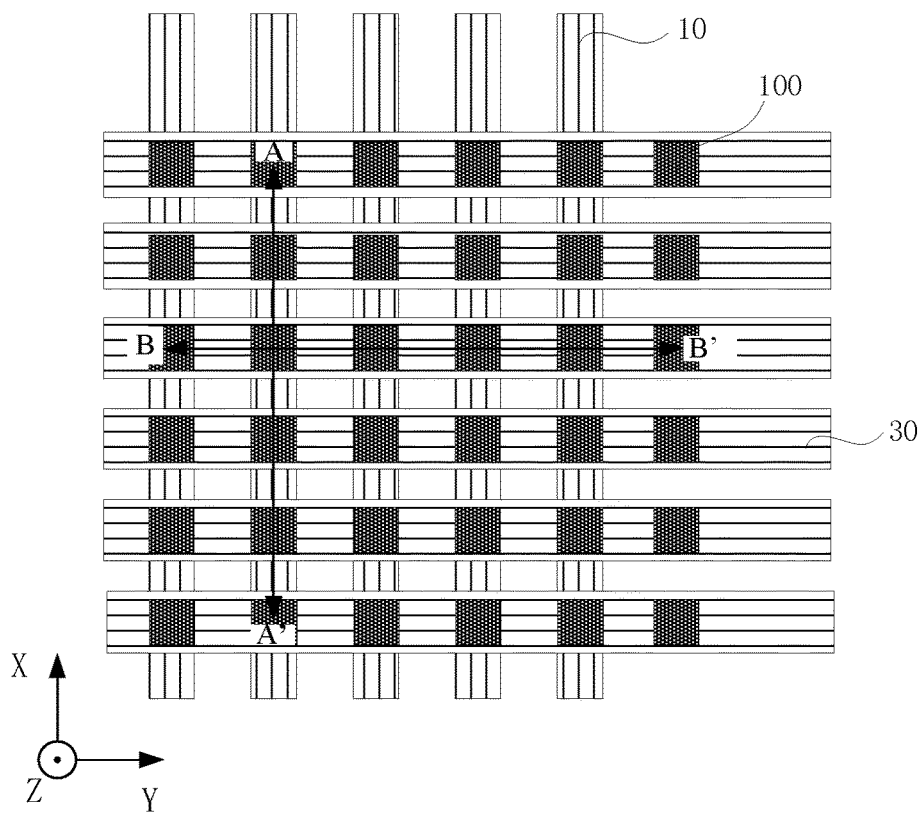
FIG. 2 is a schematic distribution diagram of bit lines and word lines in a semiconductor structure according to an embodiment.

It should be supplemented that, as understood with reference to FIG. 1 and FIG. 2, the above-mentioned memory cells 100 may be distributed in an array on the substrate, and the memory cells 100 in each row are correspondingly connected to one word line 30, and the memory cells 100 in each column are correspondingly connected to one bit line 10, to constitute the semiconductor structure. The plurality of bit lines 10 are distributed at intervals in parallel, and each bit line 10 extends along a first direction (e.g., an X direction in FIG. 2). The plurality of word lines 30 are distributed at intervals in parallel, and each word line 30 extends along a third direction (e.g., a Y direction in FIG. 2).

In a memory device whose transistor uses the VGAA transistor, the use of the buried word lines and the buried bit lines may simplify a structure (such as a bit line contact structure) between the array device and the capacitor. However, the existing buried bit lines still have problems of high resistance and complicated fabrication process of the bit line contact structure.

Embodiments of the present disclosure provide a method for fabricating a semiconductor structure, which may be used for fabricating the DRAM. In addition, by using the method for fabricating the semiconductor structure in the embodiments of the present disclosure, the problems of high resistance and complicated fabrication process of the bit line contact structure can be solved for the existing buried bit lines.

Figure 3:
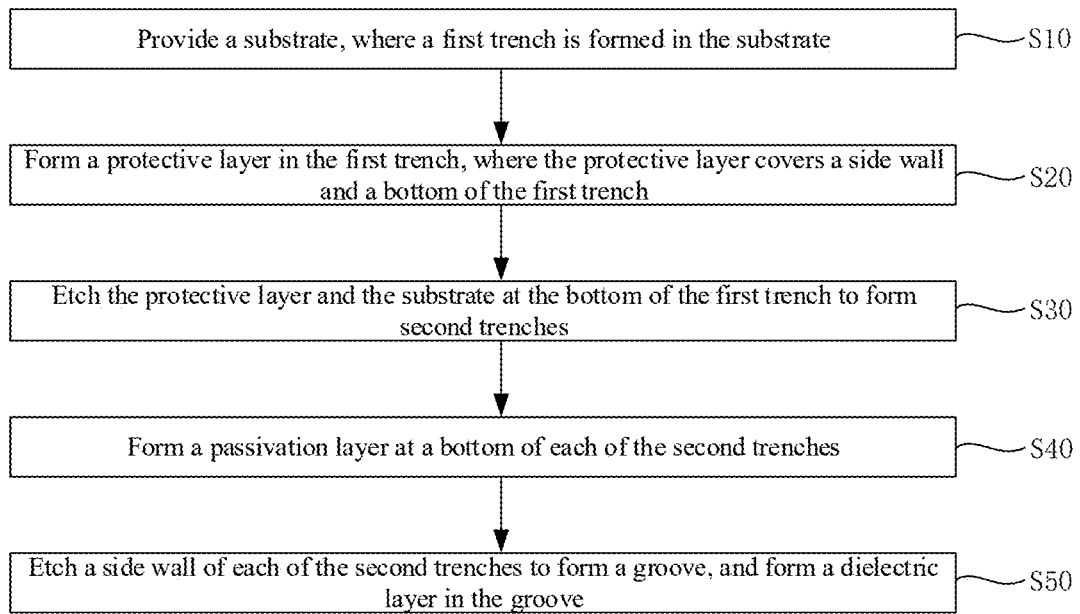
FIG. 3 is a flowchart of a method for fabricating the semiconductor structure according to an embodiment.

Referring to FIG. 3, the method for fabricating the semiconductor structure provided by the embodiments of the present disclosure includes Steps S10 to S50.

S10: providing a substrate, where a first trench is formed in the substrate.

S20: forming a protective layer in the first trench, where the protective layer covers a side wall and a bottom of the first trench.

S30: etching the protective layer and the substrate at the bottom of the first trench to form second trenches.

S40: forming a passivation layer at a bottom of each of the second trenches.

S50: etching a side wall of each of the second trenches to form a groove, and forming a dielectric layer in the groove.

In some examples, the groove may be a bit line trench in the DRAM, and the dielectric layer may be a conductive layer. Forming the dielectric layer in the groove may be manifested as: forming a bit line in the groove. However, the dielectric layer is not limited thereto, and the dielectric layer may also be configured to form other conductive structures.

In other examples, the groove may be configured to form other types of bottom linear structures other than the conductive structures. For example, the dielectric layer may be an insulating layer, and the forming the dielectric layer in the grooves may be manifested as: forming bottom isolation structures in the groove.

In the embodiments of the present disclosure, the first trench may be formed in the substrate, and the protective layer covering the side wall and the bottom of the first trench may be formed in the first trench. Next, the protective layer and the substrate at the bottom of the first trench may be etched to form second trenches. Next, before etching a side wall of each second trench to form a groove and forming the dielectric layer in the groove, the passivation layer may be formed at the bottom of each second trench. In this way, when forming the groove, the passivation layer may be configured to effectively protect the substrate at the bottom of each second trench, and it is beneficial to ensure that the groove is formed along a direction perpendicular to a side wall of each second trench.

From the above, the embodiments of the present disclosure provide a method that is convenient for fabricating other layer structures (i.e., dielectric layers) at the bottoms of the trenches. Structural dimensions of the dielectric layers may be ensured by controlling a depth of each second trench, and the dielectric layers may be obtained by means of filling after the side wall of each second trench is etched to form the groove, such that each dielectric layer is positioned at the bottom of the first trench and is in direct contact with a part surrounded by the first trench. Moreover, in the process of fabricating the dielectric layers, the protective layer may effectively protect the side wall of the first trench, and the passivation layer may effectively protect the part of the substrate at the bottom of each second trench, such that the fabrication of the dielectric layers may be prevented from additionally affecting the substrate and the side wall of the first trench.

On this basis, after the above method provided in the embodiments of the present disclosure is applied to a dynamic random access memory (DRAM), the dielectric layers may be fabricated as the buried bit lines. For example, a portion exposed by the side wall of the first trench includes an active portion of the VGAA (i.e., the pillar structure 20), and the groove is the bit line trench. In this way, after the groove is formed, the dielectric layers may be formed in the groove to form the bit lines, and it is ensured that the bit lines are positioned below the active part of the VGAA and are connected to the active part of the VGAA, such that there is no need to fabricate the bit line contact structure. That is, such a process of the bit line contact structure may be eliminated from the fabrication process of the DRAM to simplify the fabrication process of the DRAM. Moreover, in the above method, the bit lines may be formed by filling the groove with a dielectric material, which facilitates selection of formation materials of the bit lines to form bit lines with lower resistances, thereby improving electrical properties of the DRAM.

Use of the method for fabricating the semiconductor structure provided by the embodiments of the present disclosure in the DRAM is described in detail below with reference to FIG. 4 to FIG. 17.

Figure 4:
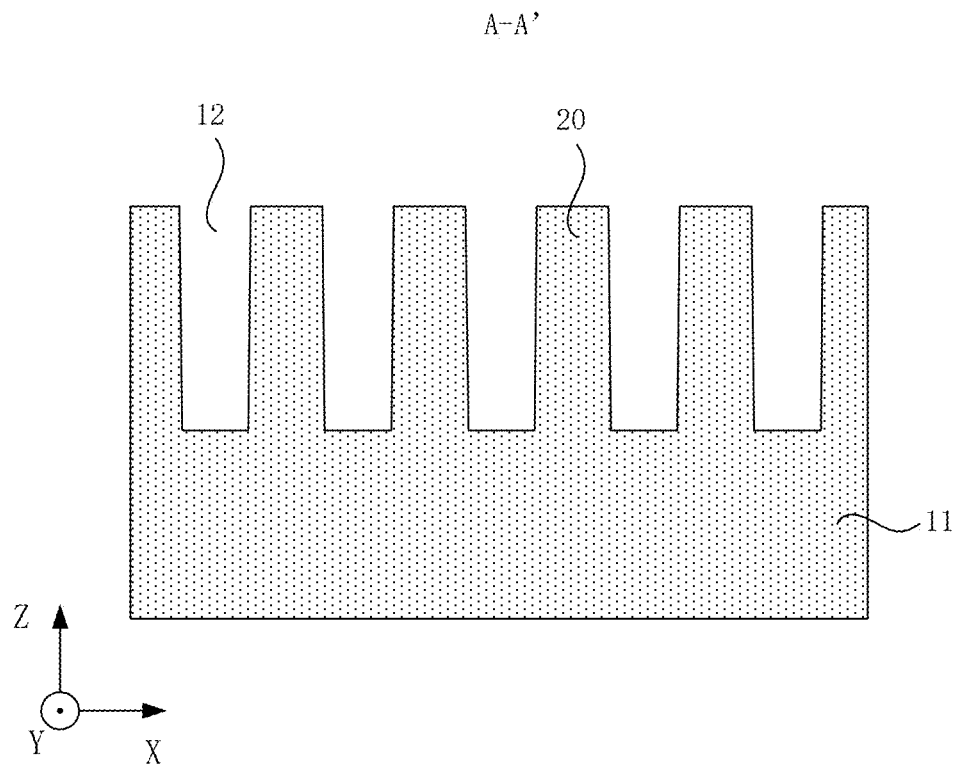
FIGS. 4 to 20 respectively are cross-sectional views of structures obtained in steps of the method for fabricating the semiconductor structure according to an embodiment along an AA' direction and a BB' direction.
Figure 5:
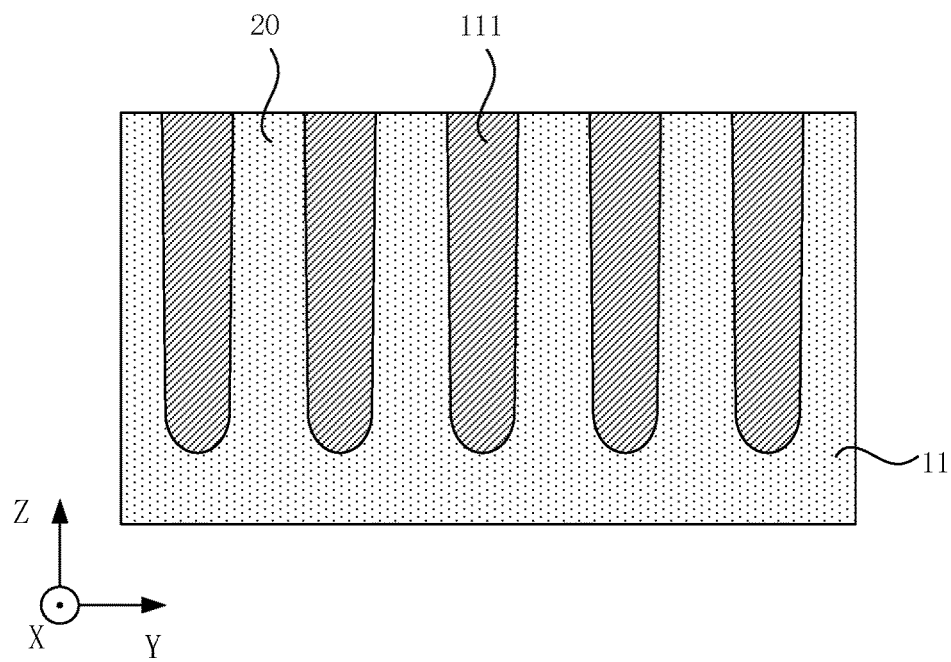

In Step S10, referring to FIG. 4 and FIG. 5, a substrate 11 is provided, and a first trench 12 is formed in the substrate 11.

It is to be understood that, before the first trench 12 is formed in the substrate 11, a shallow trench may also be formed in the substrate 11, and a shallow trench isolation structure 111 is formed in the shallow trench. That is, the provided substrate 11 may include the shallow trench isolation structure 111. The shallow trench isolation structure 111 can isolate a plurality of active areas on the substrate 11. Next, part of materials of the substrate 11 positioned in the active areas and part of the shallow trench isolation structure 111 may be removed to form the first trench 12 in the substrate 11, where the first trench 12 extends, for example, along the third direction, which is the Y direction for example.

For example, the substrate 11 includes, but is not limited to, a silicon substrate, a germanium substrate, a silicon germanium substrate, or a silicon nitride substrate.

For example, the shallow trench isolation structure 111 includes, but is not limited to, an oxide such as silicon oxide.

In the embodiments of the present disclosure, when forming the first trench 12, part of the side wall of the columnar structure 20 in the VGAA may be exposed in the first trench 12. For example, the depth of the first trench 12 is equal to the height of the columnar structure 20. That is, a formation depth of the first trench 12 may be limited by the height of the columnar structure 20.

After the first trench 12 is formed, the method for fabricating the semiconductor structure further includes: performing ion implantation on a lower part and an upper part of the columnar structure 20 respectively to form a source, a drain, and a conductive channel positioned between the source and the drain. The source is positioned at the lower part of the columnar structure 20, and the drain is positioned at the upper part of the columnar structure 20. Types of ions needing to be implanted to form the source and the drain are different, which are not limited in the embodiments of the present disclosure. In addition, a depth of ions needing to be implanted to form the source and the drain may be selected and set according to actual requirements.

Figure 6:
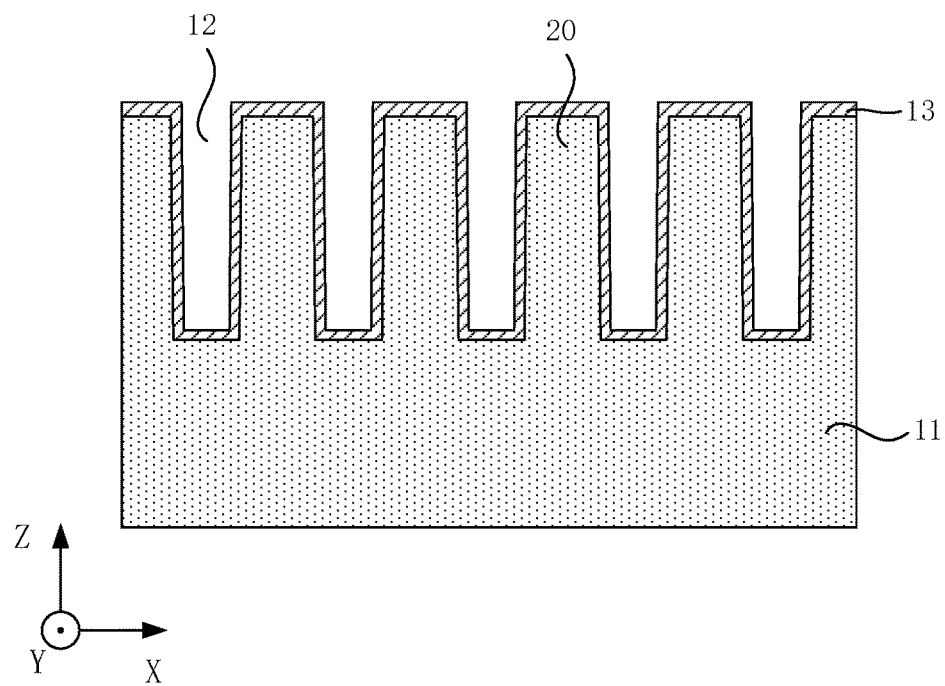
Figure 7:
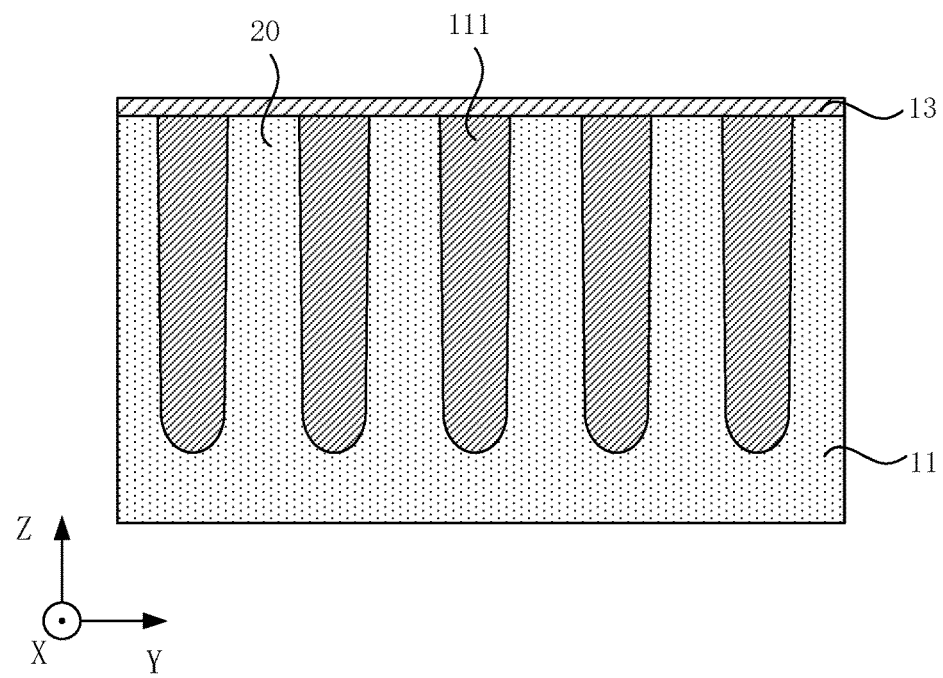

In Step S20, referring to FIG. 6 and FIG. 7, a protective layer 13 is formed in the first trench 12, and the protective layer 13 covers the side wall and the bottom of the first trench 12.

For example, the protective layer 13 includes, but is not limited to, nitrides such as silicon nitride.

For example, the protective layer 13 also covers the top of the columnar structure 20 and the top of the shallow trench isolation structure 111 and the side wall exposed in the first trench 12. That is, the protective layer 13 may be directly deposited on a side of the structure obtained after the first trench 12 is formed.

In some embodiments, deposition of the protective layer 13 includes, but is not limited to, physical vapor deposition (PVD), chemical vapor deposition (CVD) or atomic layer deposition (ALD).

In the embodiments of the present disclosure, by forming the protective layer 13, the structures on the substrate 11 that do not need to be etched may be protected in the subsequent etching process. For example, the side wall of the first trench 12 may be protected from causing damage to these structures in the etching process.

Figure 8:
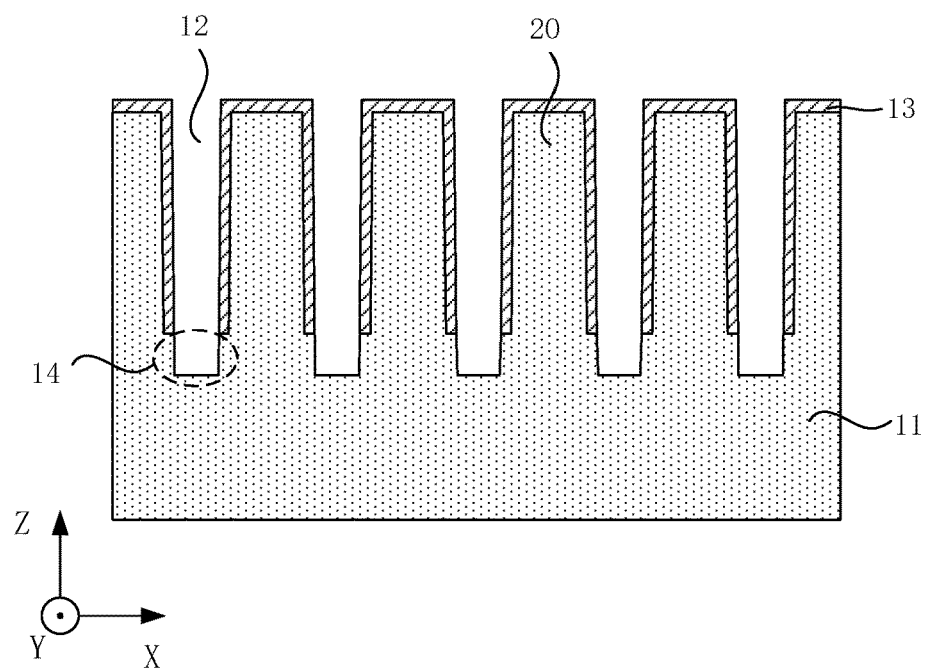
Figure 9:
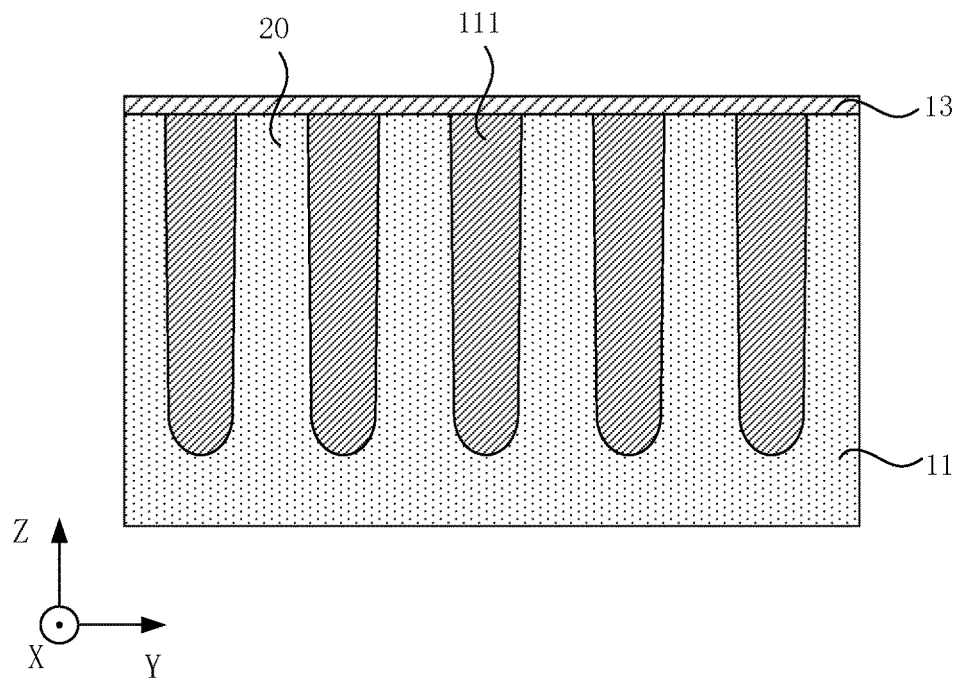

In Step S30, referring to FIG. 8 and FIG. 9, the protective layer 13 and the substrate 11 at the bottom of the first trench 12 are etched to form a second trench 14.

After the first trench 12 and the protective layer 13 are formed, the protective layer 13 at the bottom of the first trench 12 may be removed first to expose the substrate 11 below the first trench 12, and then the substrate 11 is further etched on the basis of the first trench 12, to form the second trench 14.

For example, the protective layer 13 at the bottom of the first trench 12 may be removed by means of dry etching, such that an etching region and an etching direction can be precisely controlled to prevent the protective layer 13 covering the side wall of the first trench 12 from being etched simultaneously.

In addition, in some embodiments, in the process of removing the protective layer 13 positioned at the bottom of the first trench 12, a portion of the protective layer 13 covering the top of the columnar structure 20 may also be removed by means of simultaneous etching.

For example, each second trench 14 is formed by removing the part of the substrate 11 positioned at the bottom of the first trench 12, and the formation depth of each second trench 14 may be set to match the height of each dielectric layer to be formed. In some embodiments, sum of the depth of the first trench 12 and the depth of each second trench 14 is smaller than the height of the shallow trench isolation structure 111. In this way, after the dielectric layers are formed, the adjacent dielectric layers may be effectively isolated by means of the shallow trench isolation structure 111. For example, when the dielectric layers are configured to form the bit lines, adjacent bit lines may be isolated by means of the shallow trench isolation structure 111 to avoid occurrence of electrical coupling between the adjacent bit lines.

Figure 10:
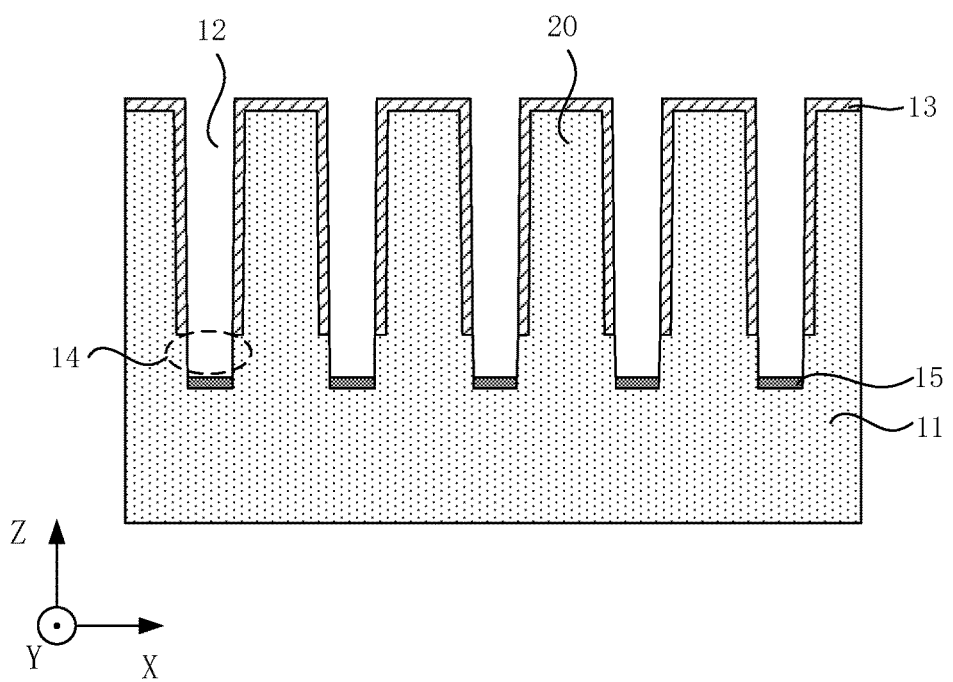
Figure 11:
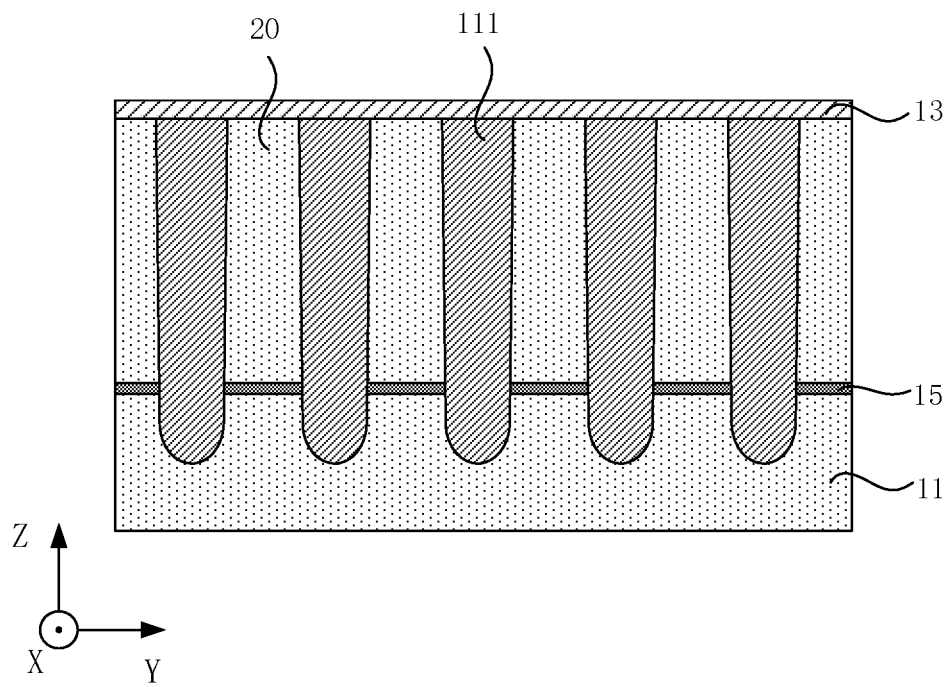

In Step S40, referring to FIG. 10 and FIG. 11, a passivation layer 15 is formed at the bottom of the second trench 14.

In some embodiments, the forming the passivation layer 15 at the bottom of the second trench 14 includes: performing plasma injection on the substrate 11 exposed at the bottom of the second trench 14 to transform part of the substrate 11 into the passivation layer 15.

For example, plasma injection is performed on the substrate 11 by means of boron ions, to transform part of the substrate 11 into the passivation layer 15. It should be understood that the passivation layer 15 is a structure jointly formed by the implanted ions and the substrate 11. For example, when the substrate 11 is a silicon substrate, the passivation layer 15 is a structure jointly formed by boron and silicon, that is, a structure formed by doping silicon with boron.

For example, a formation thickness of the passivation layer 15 may be selected and set according to actual requirements. For example, the formation thickness of the passivation layer 15 is less than or equal to one fifth of the height of the second trench 14.

In Step S50, referring to FIGS. 12 to 15, a side wall of each of the second trenches 14 is etched to form a groove 16, and a dielectric layer 17 is formed in the groove 16.

Figure 12:
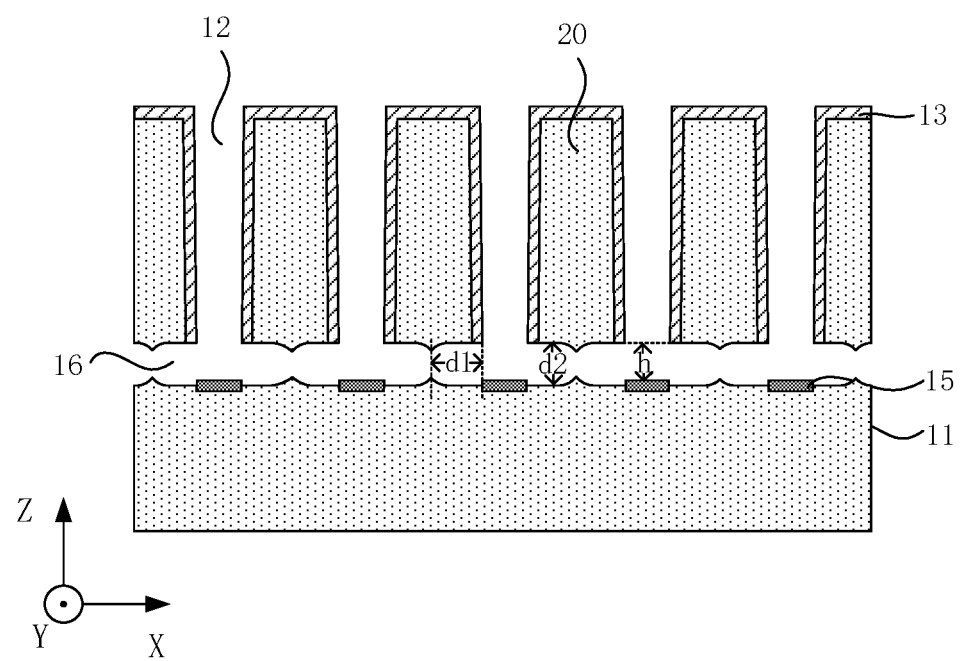
Figure 13:
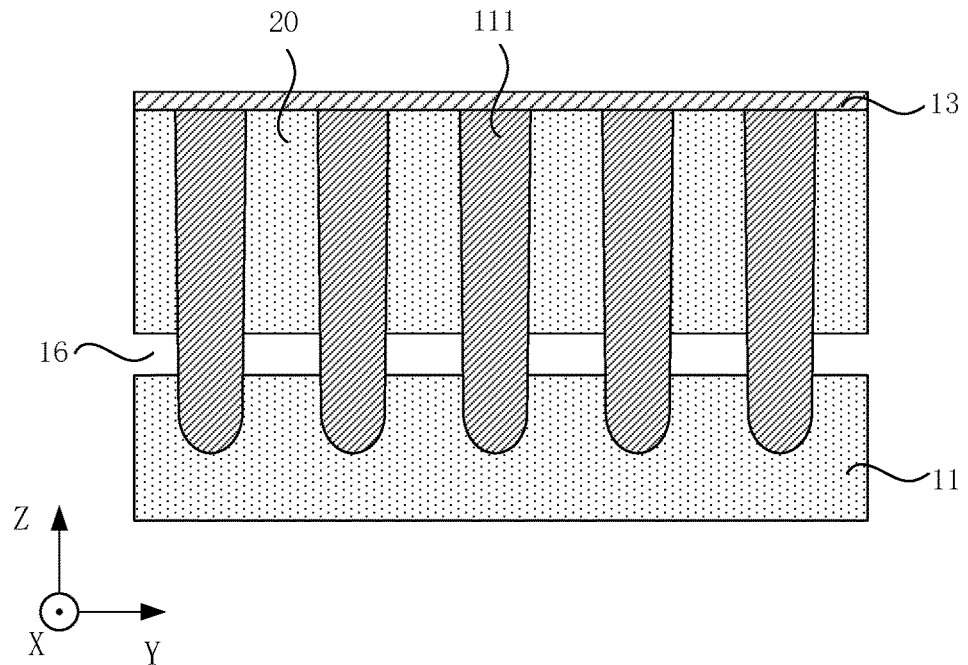

As shown in FIG. 12 and FIG. 13, after the passivation layer 15 is formed, the side walls of the second trenches 12 may be etched to communicate the adjacent second trenches 12 along the first direction (e.g., the X direction). The first direction is, for example, a column direction. Thus, the grooves 16 positioned below a plurality of columnar structures 20 in the same column are formed.

For example, the groove 16 is communicated with the adjacent second trenches 14 and extends along the first direction (e.g., the X direction). In this way, an extension channel may be formed below the columnar structures 20 to facilitate the formation of the bit line trench in the groove 16, thereby forming the buried bit lines by filling the groove 16 with the dielectric layers 17.

For example, the side walls of the second trenches 14 are etched by means of an anisotropic etching process. Anisotropic etching refers to etching that occurs at different rates in different directions. For the process of forming the groove in the embodiments of the present disclosure, the etching rate of the side wall of each second trench 14 along the first direction (e.g., the X direction) is higher than that of the side wall of each second trench 14 along the second direction (e.g., the Z direction). Herein, the etching rates of the second trenches 14 along different directions may be selected and determined according to the structures of the dielectric layers 17 to be formed.

In the embodiments of the present disclosure, the anisotropic etching process has high etching precision. Therefore, etching the side walls of the second trenches 14 by means of the anisotropic etching process may achieve fine control of the formation contour of the groove 16.

In some embodiments, still referring to FIG. 12, the etching dimension d1 of the side wall of each second trench 14 in the first direction (e.g., the X direction) is larger than the etching dimension d2 of the side wall of each second trench 14 in the second direction (e.g., the Z direction). The first direction (e.g., the X direction) is a direction perpendicular to the side wall of each second trench 14, and the second direction (e.g., the Z direction) is a direction perpendicular to the substrate 11.

In some embodiments, still referring to FIG. 12, the etching dimension d1 of the side wall of each second trench 14 in the first direction (e.g., the X direction) is larger than the height h of each second trench 14 in the second direction (e.g., the Z direction). The first direction (X direction) is a direction perpendicular to the side wall of each second trench 14, and the second direction (Z direction) is a direction perpendicular to the substrate 11.

In the embodiments of the present disclosure, by controlling an etching dimension d1 of the side wall of the second trench 14 in the first direction (e.g., the X direction) to be larger than an etching dimension d2 of the side wall of the second trench 14 in the second direction (e.g., the Z direction), and by controlling the etching dimension d1 of the side wall of the second trench 14 in the first direction (e.g., the X direction) to be larger than a height h of the second trench 14 in the second direction (e.g., the Z direction) (i.e., by controlling an etching degree of the side wall of the second trench 14 in the first direction to be larger than an etching degree of the side wall of the second trench 14 in the second direction), the groove 16 can extend along the direction perpendicular to the side wall of the second trench 14 to form the channel, while reducing the etching of the substrate 11 below the second trench 14. In this way, it may be avoided that the depth of the groove 16 is too large to cause excessive etching.

For example, part of the lower surface of the groove 16 may be lower than the surface of the passivation layer 15. That is, in the etching process, a part of the substrate 11 not covered by the passivation layer 15 may be easily removed by means of etching, such that the lower surface of the groove 16 is a curved surface. For example, the lower surface of the groove 16 extends wavily along the first direction. But it is not limited to this. For example, the passivation layer 15 may also be removed simultaneously during the formation of the groove 16, or may be removed after the formation of the groove 16.

Figure 14:
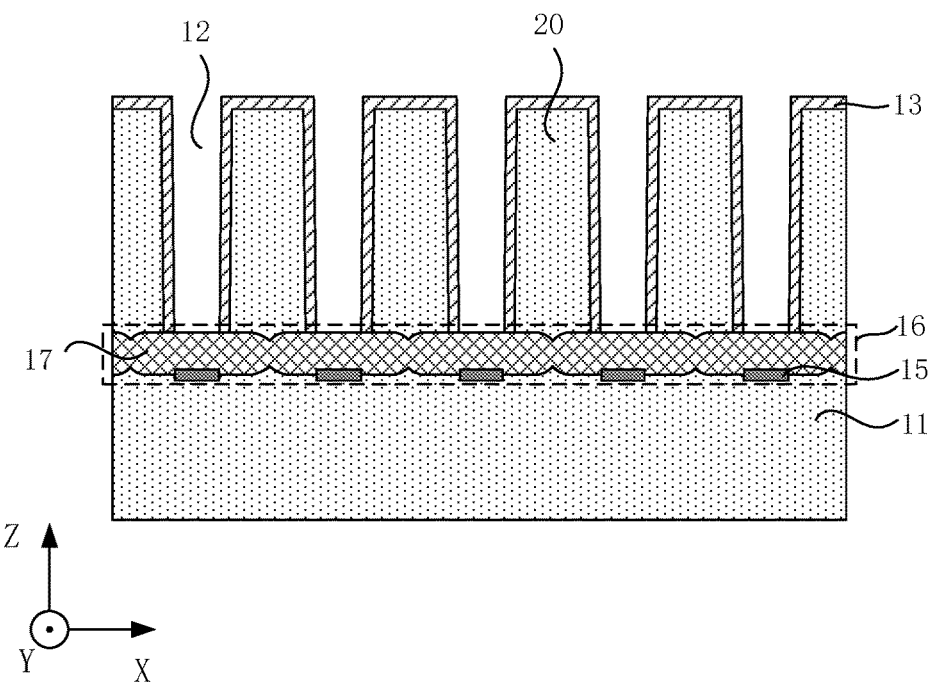
Figure 15:
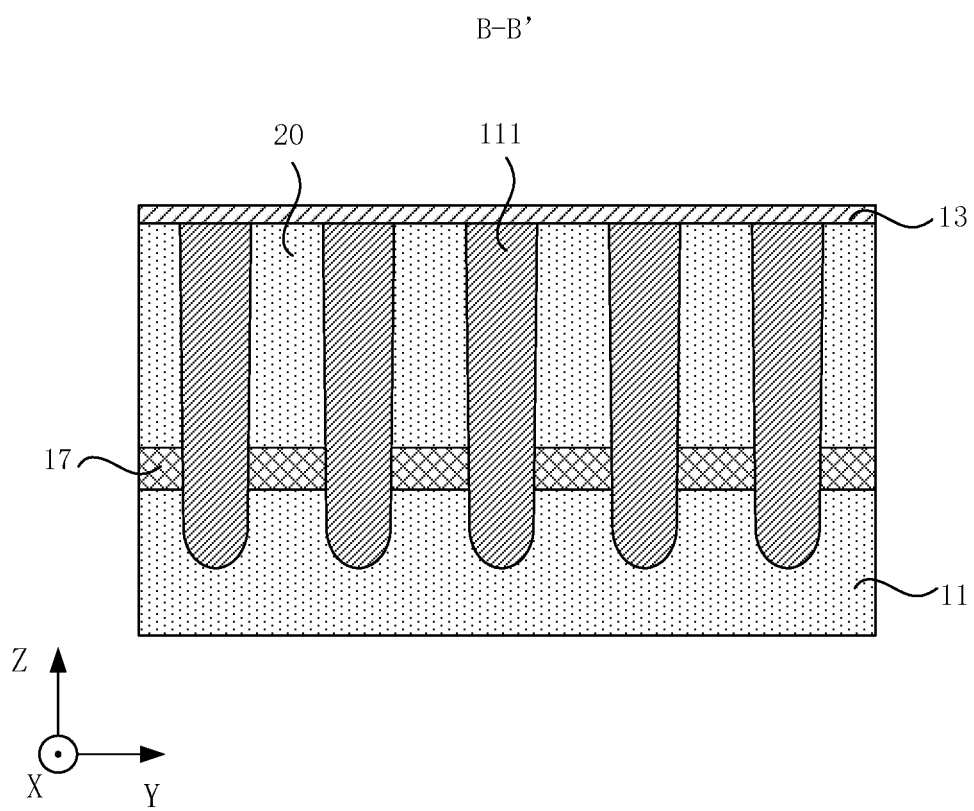

As shown in FIG. 14 and FIG. 15, after the groove 16 is formed, the dielectric layer 17 may be formed in the groove 16.

For example, the lower surface of the dielectric layer 17 matches the lower surface of the groove 16 and extends wavily along the first direction (e.g., the X direction).

For example, the dielectric layers 17 may be deposited in the groove 16 along the first trench 12.

In some embodiments, the deposition mode of the dielectric layers 17 includes, but is not limited to, physical vapor deposition, chemical vapor deposition, or atomic layer deposition.

For example, each dielectric layer 17 includes a conductive layer or an insulating layer. When the dielectric layers 17 are conductive layers, the dielectric layers 17, for example, may be configured to form the bit lines. When the dielectric layers 17 are insulating layers, the dielectric layers 17, for example, may be configured to form bottom isolation structures.

It should be understood that the dielectric layers 17 may be single-layer structures or stacked-layer structures.

In some examples, the dielectric layers 17 include metal layers. The forming the dielectric layers 17 in the groove 16 includes: filling the groove 16 with the metal layers.

In some examples, the materials of the metal layers include, but are not limited to, tungsten (W), copper (Cu), titanium (Ti), or tantalum (Ta).

In the embodiments of the present disclosure, by filling the groove 16 with the metal layers to form the dielectric layers 17, the resistances of the dielectric layers 17 may be reduced, thereby improving the electrical properties of the semiconductor structure.

In some other examples, the dielectric layers 17 include metal silicide layers and metal layers. The forming the dielectric layers 17 in the groove 16 includes: forming the metal silicide layers covering the side wall and the bottom of the groove 16; and forming the metal layers covering the metal silicide layers.

In some embodiments, the substrate 11 is a silicon substrate, and the metal silicide includes but is not limited to tantalum silicide ($Ta_5Si_3$), cobalt silicide ($CoSi_2$) or tungsten silicide ($WSi_2$).

In the embodiments of the present disclosure, before forming the metal layers, forming the metal silicide layers in advance may further reduce the resistances of the dielectric layers 17, thereby further improving the electrical properties of the semiconductor structure.

In some embodiments, the groove 16 includes a bit line trench; and the forming the dielectric layer 17 in the groove 16 includes: forming a bit line in the groove 16.

The metal layers or the stacked-layer structures formed by the metal layers and the metal silicide layers in some of the foregoing embodiments may be used as the bit lines.

In some embodiments, referring to FIG. 16 to FIG. 20, the method in the embodiments of the present disclosure further includes following steps.

Figure 16:
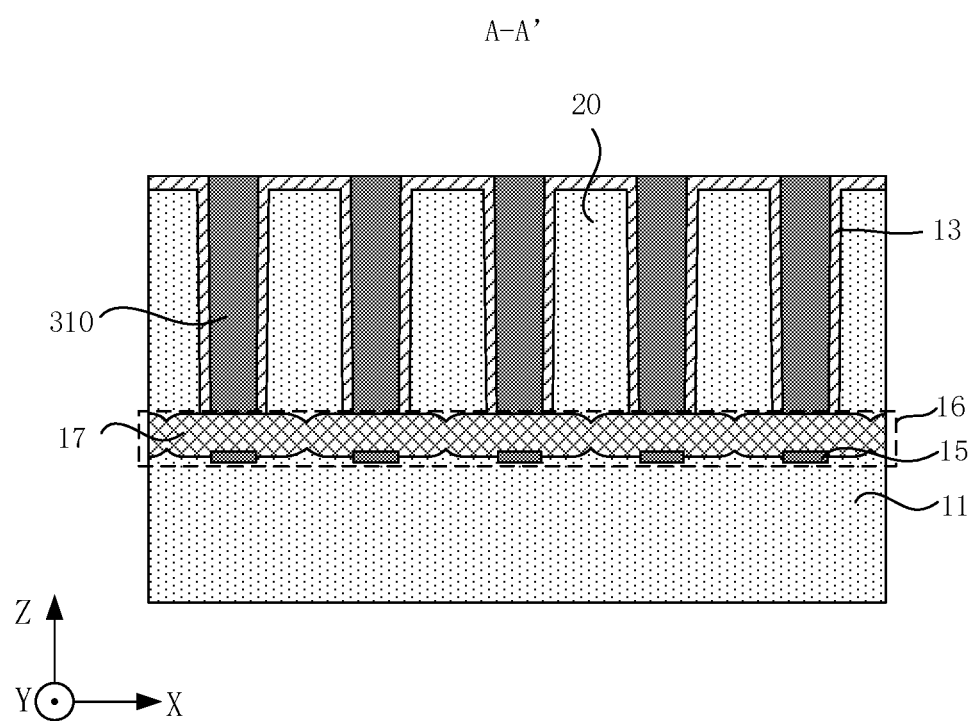

As shown in FIG. 16, an insulating material 310 is filled in the first trench 12.

Figure 17:
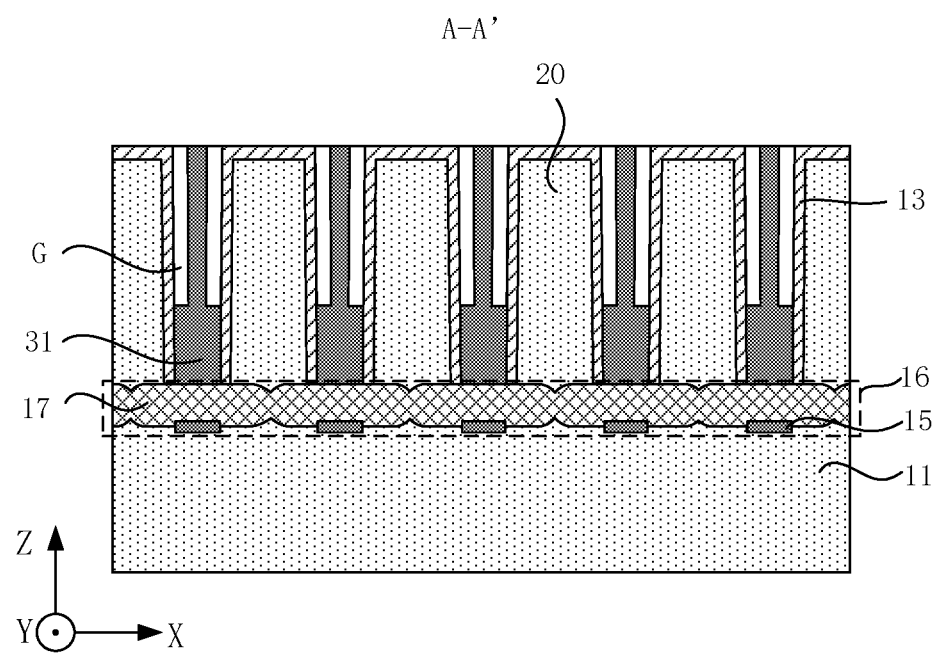
Figure 18:
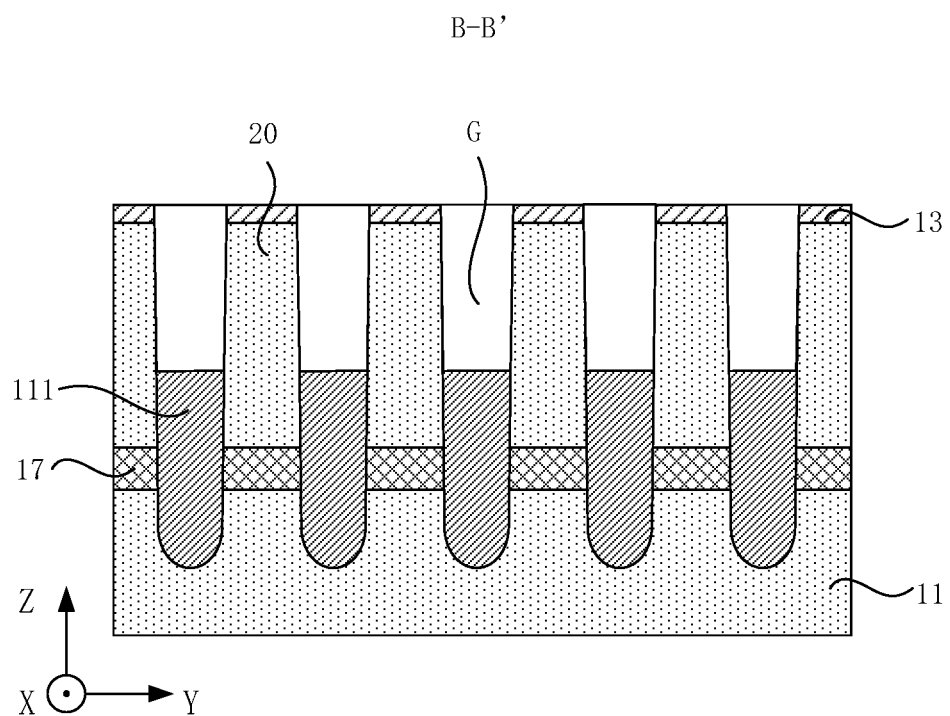

As shown in FIG. 17 and FIG. 18, after the insulating material 310 is filled, the substrate 11 is etched back to form a word line trenches G.

Here, the word line trench G may be formed by removing part of the insulating material 310 and part of the shallow trench isolation structure 111. Also, after the word line trench G is formed, remaining part of the insulating material 310 may form an insulating layer 31 in the first trench 12.

Figure 19:
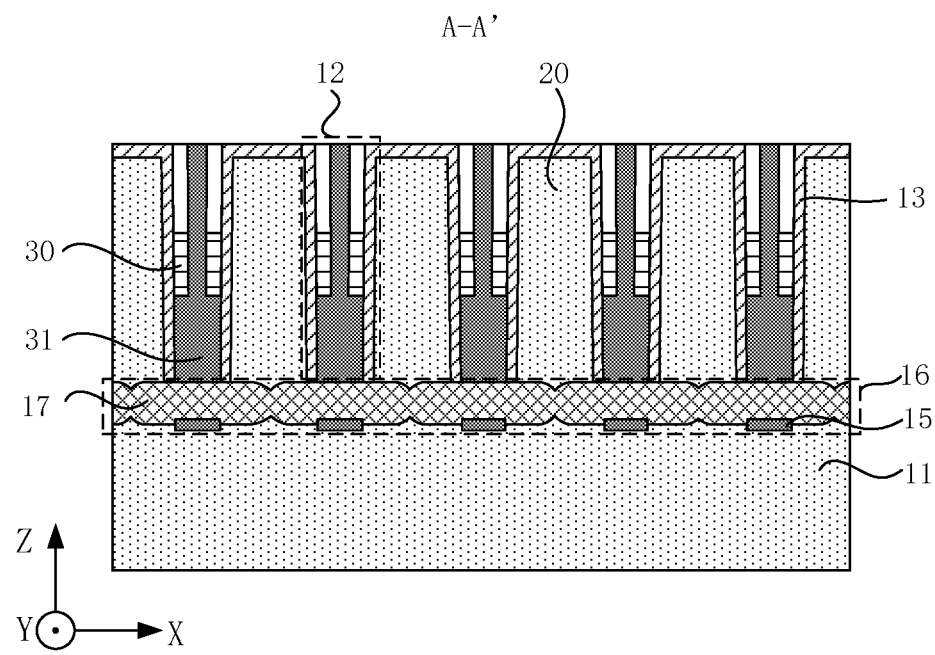
Figure 20:
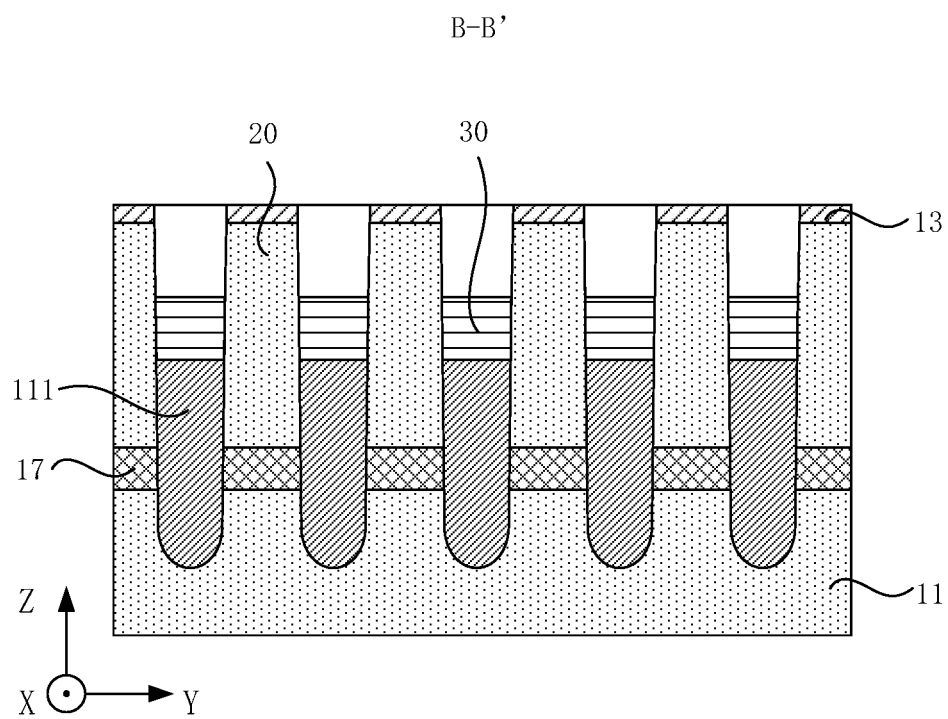

As shown in FIG. 19 and FIG. 20, word lines 30 are formed in the word line trench G. The word lines 30 extend along the third direction (e.g., the Y direction).

It is to be understood that, in the embodiments of the present disclosure, the word lines 30 are positioned below the surface of the substrate 11. That is, the word lines 30 are buried word lines. Moreover, the adjacent word lines 30 may be insulated by the insulating layer 31.

For example, each word line 30 includes a gate word line, and a part of the word line 30 positioned on an outer peripheral side of the conductive channel may be used as the gate of the VGAA transistor. Moreover, a gate dielectric layer (not shown in the figure) may be formed between each word line 30 and the conductive channel of each columnar structure 20.

For example, the material of the insulating layer 31 includes, but is not limited to, oxides such as silicon oxide.

For example, materials for forming the word lines 30 include, but are not limited to, tungsten (W), copper (Cu), titanium (Ti), tantalum (Ta), titanium nitride (TiN), tantalum nitride (TaN), or any combination thereof.

In the embodiments of the present disclosure, the bit lines may be directly formed by forming the dielectric layers 17 in the groove 16. That is, the buried bit lines positioned below the columnar structures 20 may be formed. This ensures that the bit lines are connected to the columnar structures 20, such that the bit line contact structure does not need to be fabricated. That is, such a process of the bit line contact structure may be eliminated from the fabrication process of the DRAM to simplify the fabrication process of the DRAM. Moreover, in the embodiments of the present disclosure, the structures of the bit lines may be limited by means of the dimension of the groove 16, such that the dimensions of the bit lines may be finely controlled while simplifying the fabrication process of the bit lines, to avoid the electrical coupling between the adjacent bit lines.

In addition, it is to be understood that formation heights of the word lines 30 may be selected and set according to requirements. Moreover, in some embodiments, the isolation structures may also be formed above the word lines 30 to insulate the word lines 30 from other conductive structures on the surface of the substrate 11. In some embodiments, the protective layer 13 positioned at the top of the columnar structure 20 may be removed by etching to expose the top of the columnar structure 20, to facilitate the formation of the memory node contact structure or the memory capacitor at the top of the columnar structure 20.

Based on the same inventive concept, the embodiments of the present disclosure also provide a semiconductor structure, which may be fabricated and formed by the method in some of the foregoing embodiments.

Referring to FIG. 19 and FIG. 20, the semiconductor structure includes: a substrate 11, a protective layer 13, and a dielectric layer 17. The substrate 11 is internally provided with a first trench 12 and a groove 16 positioned below the first trench 12. The protective layer 13 covers a side wall of the first trench 12. The dielectric layer 17 fills the groove 16.

In some embodiments, the semiconductor structure further includes a passivation layer 15 positioned at a bottom of the groove 16. The dielectric layer 17 also covers the passivation layer 15.

In some examples, the groove 16 may be a bit line trench in the DRAM, and the dielectric layer 17 may be formed of a conductive material, where the dielectric layer 17 includes bit lines. In some other examples, the dielectric layer 17 may be formed of a composite material. For example, the dielectric layer 17 includes a bottom isolation structure formed of an insulating material, and a bit line conductive structure formed of a conductive material.

For example, the substrate 11 includes, but is not limited to, a silicon substrate, a germanium substrate, a silicon germanium substrate, or a silicon nitride substrate.

In some embodiments, the substrate 11 includes a shallow trench isolation structure 111. The shallow trench isolation structure 111 can isolate a plurality of active areas on the substrate 11. The first trench 12 may be formed by removing part of material of the substrate 11 in the active area and part of the shallow trench isolation structure 111.

For example, the substrate 11 further includes a plurality of columnar structures 20. The column structures 20 are positioned in the active areas, and the first trench 12 exposes at least part of side walls of the column structure 20 and part of side walls of the shallow trench isolation structure 111. In some embodiments, each of the columnar structures 20 includes a source, a conductive channel and a drain arranged from bottom to top.

The protective layer 13 also covers the shallow trench isolation structure 111 and the side walls of the column structure 20 exposed in the first trench 12. For example, the shallow trench isolation structure 111 includes, but is not limited to, an oxide such as silicon oxide. For example, the protective layer 13 includes, but is not limited to, nitrides such as silicon nitride.

In the embodiments of the present disclosure, the semiconductor structure includes the substrate 11, where the substrate 11 is internally provided with the first trench 12 and the groove 16 positioned below the first trench 12. In some embodiments, the groove 16 includes a bit line trench; and the dielectric layer 17 includes bit lines. The bit lines here are the buried bit lines positioned at the bottom of the substrate 11. In addition, the bottom surface of the dielectric layer 17 is generally higher than that of the shallow trench isolation structure 11, such that the adjacent dielectric layer 17 may be effectively isolated by means of the shallow trench isolation structure 111 to avoid occurrence of electrical coupling between the adjacent bit lines.

In some embodiments, the bit line includes a metal wire; or the bit line includes a metal silicide layer covering a side wall and a bottom of the groove 16, and a metal layer covering the metal silicide layer.

For example, materials of the metal layers include, but are not limited to, tungsten (W), copper (Cu), titanium (Ti), or tantalum (Ta).

For example, the substrate 11 is a silicon substrate, and the metal silicide includes but is not limited to tantalum silicide ($Ta_5Si_3$), cobalt silicide ($CoSi_2$) or tungsten silicide ($WSi_2$).

In the embodiments of the present disclosure, using the metal wires as the bit lines or using a stacked-layer structure formed of the metal silicide layer and the metal layer as the bit lines is beneficial to reduce the resistances of the bit lines, thereby effectively improving the electrical properties of the semiconductor structure.

In some embodiments, referring to FIG. 19, lower surfaces of the bit lines extend wavily along the first direction (e.g., the X direction).

In some embodiments, referring to FIG. 19 and FIG. 20, the semiconductor structure further includes: an insulating layer 31 disposed in the first trench 12, and a plurality of word lines 30 arranged at intervals in parallel. The bit line extends along the first direction (e.g., the X direction); the word line 30 is positioned above the bit line and extends along the third direction (e.g., the Y direction); and the third direction (e.g., the Y direction) intersects, such as vertical to, the first direction (e.g., the X direction). Adjacent word lines 30 are insulated by the insulating layer 31. In addition, the word line 30 and the bit line may be insulated from each other by the insulating layer 31.

It is to be understood that, in the embodiments of the present disclosure, the bit lines are buried bit lines, and the word lines are buried word lines.

For example, materials for forming the word lines 30 include, but are not limited to, tungsten (W), copper (Cu), titanium (Ti), tantalum (Ta), titanium nitride (TiN), tantalum nitride (TaN), or any combination thereof.

For example, each of the word lines 30 includes a gate word line, and a part of each word line 30 positioned on the outer peripheral side of the conductive channel may be used as the gate of the VGAA transistor. Moreover, a gate dielectric layer (not shown in the figure) may also be provided between each word line 30 and the conductive channel of each columnar structure 20.

In some embodiments, the passivation layer 15 is positioned directly below the first trench 12, and part of a boundary of an orthographic projection of the passivation layer 15 on the substrate 11 may overlap part of a boundary of an orthographic projection of the first trench 12 on the substrate 11. The passivation layer 15 may be formed, for example, by implanting boron ions into the substrate 11. The passivation layer 15 covers part of the bottom surface of the groove 16.

For example, a formation thickness of the passivation layer 15 may be selected and set according to actual requirements. In some embodiments, a formation thickness of the passivation layer 15 is less than one fifth of a maximum thickness of the dielectric layer 17 (e.g., the bit line).

The semiconductor structure provided in the embodiments of the present disclosure is formed by means of the method in some of the foregoing embodiments. The groove 16 is, for example, the bit line trench, and the dielectric layers 17 are, for example, the buried bit lines. The bit lines may be positioned below the column structure 20 and connected to the column structure 20, such that there is no need to fabricate the bit line contact structure. That is, such a process of the bit line contact structure may be eliminated from the fabrication process of the DRAM to simplify the fabrication process of the DRAM. Moreover, in the above method, the bit lines may be formed by filling the groove 16 with dielectric materials, which facilitates the selection of materials for forming the bit lines to form the bit lines having lower resistances, thereby improving the electrical properties of the DRAM.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A method for fabricating a semiconductor structure, comprising:
    providing a substrate, a first trench being formed in the substrate;
    forming a protective layer in the first trench, the protective layer covering a side wall and a bottom of the first trench;
    etching the protective layer and the substrate at the bottom of the first trench to form second trenches;
    forming a passivation layer at a bottom of each of the second trenches; and
    etching a side wall of each of the second trenches to form a groove, and forming a dielectric layer in the groove.

2. The method for fabricating the semiconductor structure according to claim 1, wherein the groove is communicated with adjacent two of the second trenches.

3. The method for fabricating the semiconductor structure according to claim 1, wherein the dielectric layer comprises a metal layer; and the forming the dielectric layer in the groove comprises: filling the groove with the metal layer.

4. The method for fabricating the semiconductor structure according to claim 1, wherein the dielectric layer comprises a metal silicide layer and a metal layer; and the forming the dielectric layer in the groove comprises:
    forming the metal silicide layer covering a side wall and a bottom of the groove; and
    forming the metal layer covering the metal silicide layer.

5. The method for fabricating the semiconductor structure according to claim 1, wherein the forming the passivation layer at the bottom of each of the second trenches comprises:
    performing plasma injection on the substrate exposed at the bottom of each of the second trenches to transform part of the substrate into the passivation layer.

6. The method for fabricating the semiconductor structure according to claim 1, wherein the side wall of each of the second trenches is etched by means of an anisotropic etching process.

7. The method for fabricating the semiconductor structure according to claim 6, wherein an etching dimension of the side wall of each of the second trenches in a first direction is greater than an etching dimension of the side wall of each of the second trenches in a second direction; wherein the first direction is a direction perpendicular to the side wall of each of the second trenches, and the second direction is a direction perpendicular to the substrate.

8. The method for fabricating the semiconductor structure according to claim 6, wherein the etching dimension of the side wall of each of the second trenches in a first direction is greater than a height of each of the second trenches in a second direction; wherein the first direction is a direction perpendicular to the side wall of each of the second trenches, and the second direction is a direction perpendicular to the substrate.

9. The method for fabricating the semiconductor structure claim 1, wherein the groove comprises a bit line trench; and the forming the dielectric layer in the groove comprises: forming a bit line in the groove.

10. The method for fabricating the semiconductor structure according to claim 9, further comprising:
    filling an insulating material into the first trench;
    etching back the substrate filled with the insulating material to form a word line trench; and
    forming a word line in the word line trench.

* * * * *